(12) United States Patent
Tamura et al.

(10) Patent No.: US 7,763,526 B2
(45) Date of Patent: Jul. 27, 2010

(54) WAFER AND WAFER CUTTING AND DIVIDING METHOD

(75) Inventors: Muneo Tamura, Nagoya (JP); Hiromi Ooniwa, Aichi-gun (JP)

(73) Assignee: DENSO CORPORATION, Kariya (JP)

( * ) Notice: Subject to any disclaimer, the term of this patent is extended or adjusted under 35 U.S.C. 154(b) by 894 days.

(21) Appl. No.: 11/598,651

(22) Filed: Nov. 14, 2006

(65) Prior Publication Data

US 2007/0111481 A1    May 17, 2007

(30) Foreign Application Priority Data

Nov. 16, 2005   (JP)   ............................. 2005-331205
Oct. 10, 2006   (JP)   ............................. 2006-276653

(51) Int. Cl.
*H01L 21/301* (2006.01)

(52) U.S. Cl. ................................. 438/463; 257/E21.599

(58) Field of Classification Search .................. 438/463; 257/E21.599
See application file for complete search history.

(56) References Cited

U.S. PATENT DOCUMENTS

| | | | |
|---|---|---|---|
| 6,992,026 B2 | 1/2006 | Fukuyo et al. | |
| 7,179,719 B2 * | 2/2007 | Droes et al. | ................. 438/458 |
| 2005/0173387 A1 | 8/2005 | Fukuyo et al. | |
| 2005/0181581 A1 | 8/2005 | Fukuyo et al. | |
| 2005/0184037 A1 | 8/2005 | Fukuyo et al. | |
| 2005/0189330 A1 | 9/2005 | Fukuyo et al. | |
| 2005/0194364 A1 | 9/2005 | Fukuyo et al. | |
| 2005/0202596 A1 | 9/2005 | Fukuyo et al. | |
| 2005/0205536 A1 | 9/2005 | Norikane et al. | |
| 2006/0011593 A1 | 1/2006 | Fukuyo et al. | |
| 2006/0040473 A1 | 2/2006 | Fukuyo et al. | |
| 2006/0160331 A1 | 7/2006 | Fukuyo et al. | |
| 2007/0287267 A1 | 12/2007 | Sakamoto et al. | |

FOREIGN PATENT DOCUMENTS

| | | |
|---|---|---|
| EP | 1-649-965 | 4/2006 |
| JP | A-2003-266185 | 9/2003 |
| JP | A-2005-109432 | 4/2005 |

OTHER PUBLICATIONS

Office Action dated Feb. 14, 2008 in corresponding German Patent Application No. 10 2006 053 895.1-43 (and English translation).
Office Action dated Mar. 28, 2008 in corresponding Chinese Patent Application No. 200610148542.9 (and English translation).

* cited by examiner

*Primary Examiner*—Charles D Garber
*Assistant Examiner*—Stanetta D Isaac
(74) *Attorney, Agent, or Firm*—Posz Law Group, PLC

(57) ABSTRACT

A laser beam is applied to an interior of a wafer through a top surface to form modified areas in a plurality of layers of modified area groups. Intervals of the modified areas in one of the layers of modified area groups differ from intervals of the modified areas in another one of the layers of the modified area groups, which is closer to the top surface of the wafer in comparison to the one of the layers of the modified area groups.

10 Claims, 8 Drawing Sheets

($d1=d5<d2=d4<d3$)

WAFER AND WAFER CUTTING AND DIVIDING METHOD

CROSS REFERENCE TO RELATED APPLICATION

This application is based on and incorporates herein by reference Japanese Patent Application No. 2005-331205 filed on Nov. 16, 2005 and Japanese Patent Application No. 2006-276653 filed on Oct. 10, 2006.

BACKGROUND OF THE INVENTION

1. Field of the Invention

The present invention relates to a wafer and a wafer cutting and dividing method.

2. Description of Related Art

A dicing (laser dicing) technique, which uses a laser beam to cut and divide a wafer-like workpiece into individual chips, has been under development.

For example, as recited in Japanese Patent No. 3408805 that corresponds to U.S. Pat. No. 6,992,026B2, US2005/0173387A1, US2005/0181581A1, US2005/0184037A1, US2005/0189330A1, US2005/0194364A1, US2006/0040473A1 and US2006/0160331A1, it has bee proposed that the laser beam is irradiated on the wafer-like workpiece in such a manner that a focal point of the laser beam is placed in the interior of the wafer-like workpiece to form modified areas (modified areas including crack areas, modified areas including fused areas, modified areas including areas where a refractive index changes) through multiphoton absorption from the laser beam. A cutting start area is formed by the modified areas in the wafer-like workpiece along a predetermined cutting line of the wafer-like workpiece at a predetermined depth from a laser beam incident surface of the wafer-like workpiece. The cutting of the wafer-like workpiece is initiated along the cutting start areas to cut and divide the wafer-like workpiece.

Furthermore, as recited in Japanese Unexamined Patent Publication No. 2002-205180 that corresponds to U.S. Pat. No. 6,992,026B2, US2005/0173387A1, US2005/0181581A1, US2005/0184037A1, US2005/0189330A1, US2005/0194364A1, US2006/0040473A1 and US2006/0160331A1, it has been also proposed that the laser beam is irradiated on the wafer-like workpiece to form the modified areas in the interior of the wafer-like workpiece along the predetermined cutting line. However, in this instance, a position of a focal point of the laser beam in an incident direction of the laser beam to the wafer-like workpiece is changed in the interior of the wafer-like workpiece from one to another to form multiple rows of the modified areas in the incident direction of the laser beam.

According to this Japanese Patent Publication No. 2002-205180, the multiple rows of modified areas are formed in the wafer-like workpiece in the incident direction of the laser beam. Thus, the number of cutting start areas is also increased, and thereby the wafer-like workpiece having a relatively large thickness can be easily cut along the cutting start areas.

Furthermore, as recited in Japanese Unexamined Patent Publication No. 2005-1001, which corresponds to US2006/0011593A1 and US2005/0202596A1, an expansible film may be applied to one of opposed surfaces of a planar workpiece, which includes a substrate, and a laser beam is irradiated into an interior of the substrate through the other one of the opposed surfaces of the workpiece to place a focal point of the laser beam in the interior of the workpiece, so that modified areas (fused areas) are formed by multiphoton absorption from the laser beam. The thus formed modified areas may be used to form cutting start areas in the predetermined depth of the workpiece, which is spaced by a predetermined distance from the laser beam incident surface of the workpiece, along the predetermined cutting line of the workpiece. Then, the film may be expanded to cut the workpiece into multiple pieces in such a manner that the cutting is initiated in the cutting start areas.

According to the technique recited in Japanese Unexamined Patent Publication No. 2005-1001, the film is expanded after the formation of the cutting start areas in the interior of the substrate, so that the stretching stress can be appropriately applied to the cutting start areas to start the cutting initially from the cutting start areas, and thereby the substrate can be relatively accurately cut and divided into the pieces with a relatively small force.

In the recent years, the multi-layering technique of the semiconductor substrate is progressed, and the laser dicing technique recited in, for example, Japanese Patent No. 3408805, Japanese Unexamined Patent Publication No. 2002-205180 or Japanese Unexamined Patent Publication No. 2005-1001 is applied to a wafer (a semiconductor wafer), which is used in manufacturing of a semiconductor substrate having the multi-layers, to cut and divide the wafer into individual chips (semiconductor chips).

The multi-layering technique of the semiconductor substrate may include a bonding technique, a Separation by Implanted Oxygen (SIMOX) technique, a silicon on insulator (SOI) technique, a crystal growth technique for growing a III-V family chemical compound semiconductor layer on a substrate (e.g., sapphire) or a bonding technique for bonding a silicon substrate and a glass substrate together through use of anodic bonding.

FIG. 14 is a descriptive view, which indicates a way of forming modified areas by irradiating a laser beam on a wafer 50 having a bonded SOI structure according to a previously proposed technique and which schematically shows a longitudinal cross section of the wafer 50.

The wafer 50, which has the bonded SOI structure, includes a substrate Si (single crystal silicon) layer 51, a buried oxide (BOX) layer 52 and an SOI (single crystal silicon) layer 53 in this order from the bottom side to the top side thereof. Thus, the wafer 50 has the SOI structure, in which the single crystal silicon layer 53 is formed on the buried oxide layer 52 that is an insulation layer.

Here, the wafer 50, which has the bonded SOI structure, may be produced by bonding two wafers, each of which has a bonding surface (a mirror surface) that is thermally oxidized to form an oxide film thereon through the oxide films. Then, one of the two wafers is polished to a desired thickness. Here, the polished wafer becomes the SOI (single crystal silicon) layer 53, and the unpolished wafer becomes the substrate Si (single crystal silicon) layer 51, and the oxide films become the buried oxide layer 52.

A dicing film (a dicing sheet, a dicing tape, an expanded tape) 54 is bonded to the back surface (the lower surface of the single crystal silicon layer 5.1) 50a of the wafer 50.

The dicing film 54 is made of an expansible plastic film, which expands when the film is heated or when a force is applied to the film in an expansion direction. The dicing film 54 is bonded to the entire back surface of the wafer 50 through a bonding agent (not shown).

A laser processing machine (not shown) includes a laser beams source (not shown) for outputting a laser beam L and a converging lens CV. In a state where an optical axial OA of the laser beam L is placed perpendicular to the surface 50b of the wafer 50, the laser beam L is irradiated on the surface (the laser beam incident surface) 50b of the wafer 50 through the converging lens CV such that a focal point (light converging point) P of the laser beam L is placed at a predetermined point in the interior of the wafer 50. Therefore, a modified area (a modified layer) is formed at the focal point P in the interior of the wafer 50.

The laser beam L may be a laser beam that has a wavelength of 1064 nm, which is in an infrared wavelength range.

Here, the modified areas R include fused areas, which are generated mainly through the multiphoton absorption caused by the irradiation of the laser beam L.

Specifically, a portion of the wafer 50 at the focal point P of the laser beam L in the interior of the wafer 50 is locally heated through the multiphoton absorption from the laser beam L, so that the portion of the wafer 50 is melted once and is then resolidified. As described above, the portion of the wafer 50, which is melted and is then resolidified, becomes the modified area R.

That is, the fused area refers to an area, which has undergone the phase change, or an area, which has a changed crystal structure. In other words, the fused area refers to an area, in which the single crystal silicon is changed to the amorphous silicon, an area, in which the single crystal silicon is changed to the polycrystal silicon, or an area, in which the single crystal silicon is changed into a structure having the amorphous silicon and the polycrystal silicon. The wafer 50 is a bulk silicon wafer, so that the fused area is mainly made of the polycrystal silicon.

The fused area is formed mainly by the multiphoton absorption rather than simple absorption of the laser beam L in the interior of the wafer 50 (i.e., rather than the heating by the normal laser beam).

Thus, the laser beam L is not substantially absorbed in the area other the focal point P of the laser beam L in the interior of the wafer 50, and the top surface 50b of the wafer 50 is not melted.

The pulsed laser beam L is applied on the wafer 50 by the laser processing machine such that the laser beam L is scanned, i.e., run over the wafer 50 while the depth position of the focal point of the laser beam L in the interior of the wafer 50 is kept constant. In this way, the focal point P is moved along a predetermined straight cutting line (i.e., in a direction of an arrow α).

FIG. 14 shows a state where the laser beam L is scanned in a direction parallel to a plane of the drawing.

Here, it should be noted that the irradiating position of the laser beam L from the laser processing machine may be fixed without scanning the laser beam L by the laser processing machine. In this state, a table (not shown), which supports the wafer 50, may be moved in a direction perpendicular to an impinging direction of the laser beam L, i.e., an optical axis of the laser beam L (the incident direction of the laser beam L to the top surface 50b of the wafer 50).

Specifically, the focal point P of the laser beam L may be relatively moved with respect to the wafer 50 along the predetermined cutting line of the wafer 50 either by scanning the laser beam L or moving the wafer 50.

As described above, in the state where the depth position of the focal point P of the laser beam L in the interior of the wafer 50 is kept constant, when the pulsed laser beam L is irradiated in such a manner that the focal point P of the laser beam L is relatively moved with respect to the wafer 50, the multiple modified areas R (a modified area group including the multiple modified areas R) are formed at constant intervals d in a direction parallel to the top surface 50b and the back surface 50a of the wafer 50 at a fixed depth from the top surface 50b of the wafer 50 (i.e., a position that is spaced by a predetermined distance from the laser beam incident surface 50b of the wafer 50, on which the laser beam L is impinged), so that a layer of a modified area group Ga-Gc is formed.

Here, the depth of the focal pint P of the laser beam L in the interior of the wafer 50 is defined as a distance from the top surface (the laser beam incident surface) 50b of the wafer 50.

Also, the interval d of the modified areas R is defined as a center-to-center distance between a left-to-right center of one of corresponding adjacent two modified areas R and a left-to-right center of the other one of the two modified areas R in a left-to-right direction of FIG. 14 (in a direction parallel to the top surface 50b and the back surface 50a of the wafer 50).

Here, the interval d of the modified areas R of each modified area group Ga-Gc is set to be a value (d=s/f), which is obtained by dividing the relative moving speed s of the focal point P of the laser beam L with respect to the wafer 50 (the scanning speed of the laser beam L or the moving speed of the wafer 10) by the pulse oscillation frequency (a pulse repetition frequency) f of the pulsed laser beam L.

That is, in the case where the relative moving speed s of the focal point P is constant, the interval d of the modified areas R gets larger as the pulse oscillation frequency f of the laser beam L gets lower. Furthermore, in the case where the pulse oscillation frequency f of the laser beam L is constant, the interval d of the modified areas R gets larger as the relative moving speed s of the focal point P gets higher.

When the depth position of the focal point P in the interior of the wafer 50 is changed stepwise, multiple layers of modified area groups Ga-Gc are formed by the laser processing machine along the predetermined cutting line of the wafer 50 at constant intervals in a depth direction of the wafer 50 (i.e., the thickness direction of the wafer 50, the cross sectional direction of the wafer 50, the perpendicular direction that is perpendicular to the top and back surfaces 50b, 50a of the wafer 50, the top-to-bottom direction of the wafer 50), which is perpendicular to and is directed from the top surface 50b of the wafer 50.

The position (the depth position) of the focal point P of the laser beam L in the incident direction of the laser beam L on the wafer 50 (the depth direction of the wafer 50) is changed multiple times, so that the corresponding modified areas R of the layers of the modified area groups Ga-Gc are aligned in the incident direction of the laser beam while a desired interval is provided between each corresponding two modified areas R in the incident direction of the laser beam.

For example, the first layer (the lowermost layer) of the modified area group Ga is formed by relatively moving the focal point P in a state where the depth position of the focal point P is set adjacent to the back surface 50a of the wafer 50. Then, the second layer (the intermediate layer) of the modified area group Gb is formed by relatively moving the focal point P in a state where the depth position of the focal point P is set generally at a half point between the top surface 50b and the back surface 50a of the wafer 50. Thereafter, the third layer (the uppermost layer) of the modified area group Gc is formed by relatively moving the focal point P in a state where the depth position of the focal point P is set adjacent to the top surface 50b of the wafer 50.

In the case of FIG. 14, although the three layers of the modified area groups Ga-Gc are provided, the number of the layers of the modified area groups is not limited to three and may be set to two or less or four or more.

Here, in the case of the layers of the modified area groups Ga-Gc, it is desirable that the layers of the modified area groups Ga-Gc are formed one after anther from the farthest layer to the closest layer (in the order of Ga, Gb and Gc) with respect to the top surface (the laser beam incident surface) 50b of the wafer 50, on which the laser beam L impinges.

For example, in a case where the farthest layer of the modified area group Ga is formed after the formation of the closest layer of the modified area group Gc, the laser beam L applied to form the modified area group Ga is scattered by the previously formed modified area group Gc. Thus, the size of the modified area R of the modified area group Ga varies from one modified area R to another modified area R, so that the modified area Ga cannot be formed uniformly.

However, when the modified area groups Ga-Gc are formed one after anther from the farthest layer of the modified area group Ga to the closest layer of the modified area group Gc, it is possible to form a new modified area R with the focal point P of the laser beam L while no modified area R is yet formed between the incident surface 50b and the current focal point P of the laser beam L. Therefore, at this time, the laser beam L is not scattered by the previously formed modified areas R, and thereby the multiple layers of the modified area groups Ga-Gc can be uniformly formed.

However, the forming sequence of the layers of the modified area groups Ga-Gc are not limited to this and may be appropriately experimentally set through actual experiments since in some cases, generally uniform modified area groups can be possibly obtained even when the layers of the modified area groups Ga-Gc are formed one after another from the closest layer of the modified area group Gc to the farthest layer of the modified area group Ga (in the order of Gc, Gb and Ga) with respect to the top surface 50b of the wafer 50, or even when the layers of the modified area groups Ga-Gc are formed at a random layer forming sequence.

The layers of the modified area groups Ga-Gc can be formed by changing the depth position of the focal point P in the interior of the wafer 50 through, for example, any one of the following methods (I)-(III).

(I) In one method, a head (a laser head), which includes the laser beam source for outputting the laser beam L and the converging lens CV, may be moved in the direction perpendicular to the top surface 50b and the back surface 50a of the wafer 50.

(II) In another method, the table, which supports the wafer 50, may be moved in the direction perpendicular to the top surface 50b and the back surface 50a of the wafer 50.

(III) In another method, the above two methods (I) and (II) may be combined to vertically move both of the head and the table in opposite directions. According to the method (III), the time required to form the layers of the modified area groups Ga-Gc can be reduced in comparison to the methods (I) and (II).

As described above, the multiple layers of the modified area groups Ga-Gc are formed in the interior of the wafer 50, and then the dicing film 54 is stretched in the horizontal direction with respect to the respective predetermined cutting line to apply the stretching stress to the modified area groups Ga-Gc.

In the case of FIG. 14, the dicing film 54 is stretched in the direction perpendicular to the plane of FIG. 14.

Thus, the shearing stress is generated in the interior of the wafer 50. As a result, a crack (break) is generated in the depth direction of the wafer 50 from the lowermost layer of the modified area group Ga, which is closest to the dicing film 54 and serves as a crack start point. Then, another crack is generated in the depth direction of the wafer 50 from the intermediate layer of the modified area group Gb, which serves as a crack start point. Thereafter, the crack is generated in the depth direction of the wafer 50 from the uppermost layer of the modified area group Gc, which serves as a crack start point. These cracks grow further and are connected to each other. When the grown cracks reach the top and back surfaces 50b, 50a of the wafer 50, the wafer 50 is cut and is divided.

Here, the modified area groups Ga-Gc are formed along the predetermined cutting line. Thus, when the stretching stress is appropriately applied to each modified area group Ga-Gc by stretching the dicing film 54, the wafer 50 can be relatively accurately cut and divided with a relatively small force without generating unnecessary cracks in the wafer 50 through the cracking started at the respective modified areas R in the layers of the modified area groups Ga-Gc.

In the top surface 50b of the wafer 50, which has a generally circular disc shape, chips are regularly arranged in a grid pattern. Each of the predetermined cutting lines is provided between the chips. That is, multiple predetermined cutting lines are arranged to form the grid pattern on the top surface 50b of the wafer 50.

Thus, after the formation of the modified area groups Ga-Gc along the predetermined cutting lines, the dicing film 54 is stretched. Therefore, the wafer 50 is cut and divided into the chips.

In the previously proposed technique shown in FIG. 14 and the prior arts recited in Japanese Patent No. 3408805, Japanese Unexamined Patent Publication No. 2002-205180 and Japanese Unexamined Patent Publication No. 2005-1001, each of the relative moving speed s of the focal point P and the pulse oscillation frequency f is set to a corresponding constant value, so that each interval d (=s/f) of the modified areas R in each modified area group Ga-Gc is made constant.

Therefore, in the case where the wafer 50 is the bulk silicon wafer or the bulk silicon wafer having an oxide film on its surface, it is possible to reliably form the normal modified areas R in each of the layers of the modified area groups Ga-Gc, which include the lowermost layer to the uppermost layer.

However, in the case of the wafer 50, which has the bonded SOI structure, although it is possible to form the normal modified areas R in the uppermost layers of the modified area group Gc, it is difficult to form the normal modified areas R in the intermediate layer of the modified area group Gb and in the lowermost layer of the modified area group Ga.

As described above, It is difficult to form the normal modified areas R at the deep part (the deep location), which is deep from the top surface (the laser beam incident surface) 50b of the wafer 50, due to the following reason.

That is, in the wafer 50, which has the bonded SOI structure, due to a variation in the optical characteristics of each layer 51-53, the refractive index of the laser beam L varies according to the layer thickness and material of each layer 51-53.

Thus, at a boundary surface between the layer 51 and the layer 52 or between the layer 52 and the layer 53, a portion of the laser beam L is reflected. This reflected laser beam interferes with the newly impinging laser beam to cause cancellation between the reflected laser beam and the newly impinging laser beam. Therefore, the energy of the laser beam L is reduced. Furthermore, the laser beam L, which has entered into the wafer 50, is absorbed in the interior of the wafer 50. Thus, as the depth from the top surface (the laser beam incident surface) 50b of the wafer 50 gets deeper, the energy of the laser beam L is more reduced.

As a result, at the deep part of the wafer 50, the energy of the laser beam L, which is required to cause the multiphoton absorption, becomes insufficient, so that the formation of the modified areas R, which include the fused areas, becomes impossible.

FIG. 15 schematically shows the longitudinal cross section of the wafer 50, in which the layers of the modified area groups are formed.

In the case of FIG. 15, the layers of the modified area groups are formed in the wafer 50 having the total thickness of 650 μm under the processing condition where each of the relative moving speed s of the focal point P of the laser beam L and the pulse oscillation frequency f of the laser beam L is set to be constant.

In the case of FIG. 15, the normal modified areas R are formed in each of the layers of the modified area groups in a portion 50c, which ranges from the top surface (the laser beam incident surface) 50b of the wafer 50 to the depth of 478 μm. However, in a deeper portion 50d, which is deeper than the depth of 478 μm, the modified areas R are not formed.

In the wafer 50, which does not have the normal modified areas R all the way from the lowermost layer of the modified area group Ga to the uppermost layer of the modified area group Gc, unnecessary cracks are easily formed at the time of cutting and dividing the wafer 50. Thus, it is difficult to relatively accurately cut and divide the wafer 50 along the predetermined cutting lines. Therefore, the yield and the quality of the chips made from the wafer 50 are deteriorated.

In the recent years, as recited in Japanese Patent No. 3408805, Japanese Unexamined Patent Publication No. 2002-205180 and Japanese Unexamined Patent Publication No. 2005-1001, it has been attempted to cut thicker wafers with the laser dicing technique.

However, in the technique recited in Japanese Patent No. 3408805, Japanese Unexamined Patent Publication No. 2002-205180 and Japanese Unexamined Patent Publication No. 2005-1001, it is required to provide the greater number of layers of the modified areas and to reduce the intervals d of the modified areas in all of the layers of the modified area groups, which include the lowermost layer to the uppermost layer.

Therefore, the relatively long time period is required to form the layers of the modified area groups, and thereby the throughput (the productivity per unit time) is deteriorated. As a result, the above technique is not suitable for the mass production.

Furthermore, the output power W of the laser beam L needs to be increased to form the normal modified areas R in each of the layers of the modified area groups. Thus, the power consumption of the laser processing machine, which generates the laser beam L, is disadvantageously increased to cause a disadvantageous increase in the manufacturing cost at the time of cutting and dividing the wafer.

Furthermore, in the recent years, it has been demanded to reliably form the normal modified areas through use of the laser dicing technique to improve the accuracy at the time of cutting other types of wafers made of the other type of material (e.g., a material that includes glass) other than the wafer made of the semiconductor material used in the manufacturing of the semiconductor substrate.

SUMMARY OF THE INVENTION

The present invention addresses the above disadvantages.

(1) It is a first objective of the present invention to provide a wafer, in which normal modified areas are reliably formed by irradiation of a laser beam on the wafer to enable an improvement in a cutting accuracy at the time of cutting and dividing the wafer starting from the modified areas, at a relatively high throughput and a relatively low cost.

(2) It is a second objective of the present invention to provide a method for cutting and dividing a wafer, which enables an improvement in a cutting accuracy at the time of cutting and dividing the wafer starting from modified areas formed by irradiation of a laser beam on the wafer at a relatively high throughput.

To achieve the objectives of the present invention, there is provided a wafer that includes a plurality of layers of modified area groups, which are arranged one after another in a depth direction between opposed first and second surfaces of the wafer. Each of the plurality of layers of the modified area groups includes a plurality of modified areas, which are arranged at corresponding constant intervals in a direction that is parallel to the first and second surfaces of the wafer. The intervals of the modified areas in one of the plurality of layers of the modified area groups differ from the intervals of the modified areas in another one of the plurality of layers of the modified area groups, which is closer to the first surface of the wafer in comparison to the one of the plurality of layers of the modified area groups. Each modified area in each of the plurality of layers of the modified area groups is formed by multiphoton absorption from a laser beam that occurs by focusing the laser beam to a corresponding focal point in an interior of the wafer through the first surface of the wafer. The plurality of layers of the modified area groups is arranged along a predetermined cutting line of the wafer.

To achieve the objectives of the present invention, there is also provided a wafer cutting and dividing method. According to the method, a pulsed laser beam is focused to a corresponding focal point at a corresponding depth in an interior of a wafer through a first surface of the wafer. The focal point of the laser beam is relatively moved relative to the wafer along a predetermined cutting line of the wafer to form a plurality of modified areas by multiphoton absorption from the laser beam in such a manner that the modified areas are arranged at corresponding constant intervals in a direction parallel to the first surface and a second opposite surface of the wafer. The depth of the focal point of the laser beam is sequentially changed, and the relatively moving of the focal point of the laser beam is repeated every time the depth of the focal point of the laser beam is changed, so that there is formed a plurality of layers of modified area groups, which are arranged one after another in a depth direction between the first surface and a second surface of the wafer, and the intervals of the modified areas in one of the plurality of layers of the modified area groups differ from the intervals of the modified areas in another one of the plurality of layers of the modified area groups, which is closer to the first surface of the wafer in comparison to the one of the plurality of layers of the modified area groups. The wafer is cut and is divided along the predetermined cutting line through cracking of the wafer, which is started at the plurality of layers of the modified area groups formed along the predetermined cutting line.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Embodiments of the present invention will be described with reference to the accompanying drawings. In each of the following embodiments, the components similar to those of FIG. 14 will be indicated with the same numerals and will not be described further. Furthermore, in the following description, the same components are indicated with the same numerals throughout the respective embodiments, and the same parts are only described once.

First Embodiment

Figure 1:
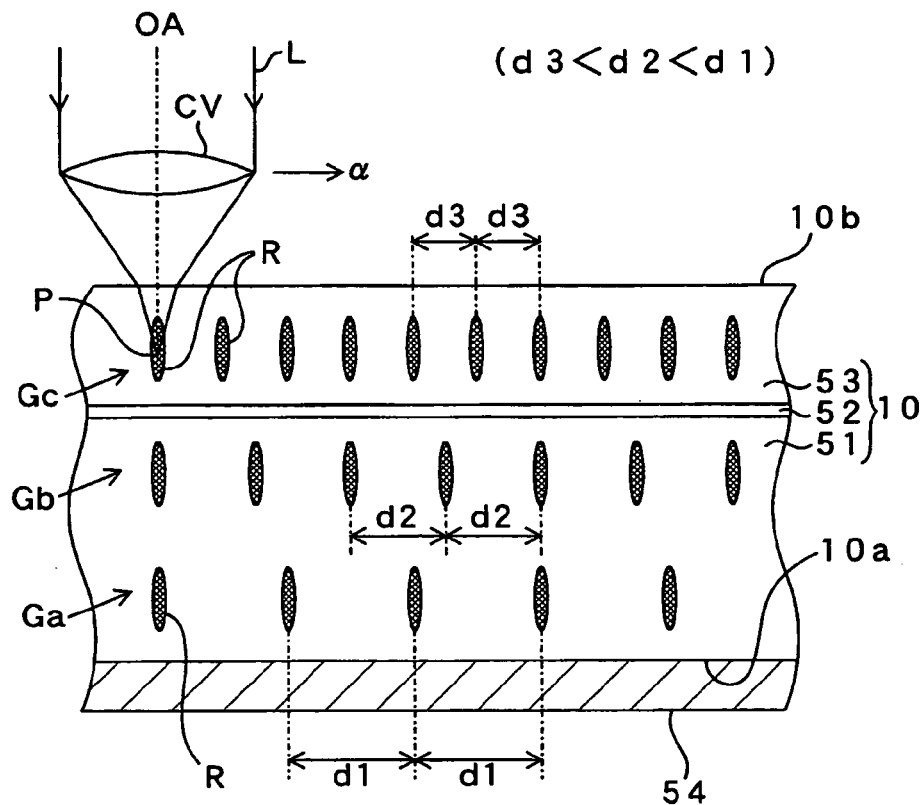
FIG. 1 is a descriptive view, which schematically shows a longitudinal cross sectional area of a wafer of a first embodiment, which has a bonded SOI structure, for describing a way of forming modified areas in the wafer by applying a laser beam to the wafer.

FIG. 1 is a descriptive view, which schematically shows a longitudinal cross sectional area of a wafer 10 of a first embodiment that has a bonded SOI structure to describe the way of forming modified areas in the wafer 10 by irradiating, i.e., applying a laser beam on the wafer 10.

Similar to the previously proposed wafer 50, the wafer (a semiconductor wafer) 10, which has the bonded SOI structure, includes a single crystal silicon layer 51, a buried oxide layer 52 and a single crystal silicon layer 53, which are stacked in this order from a bottom side to a top side of the wafer 10. Therefore, the single crystal silicon layer 53 is formed above the buried oxide layer 52, which serves as an insulation layer, to form the SOI structure.

A dicing film 54 is bonded to a back surface 10a of the wafer 10.

Similar to the previously proposed wafer 50, the wafer 10 includes a plurality of modified area groups Ga-Gc, each of which is located at a predetermined corresponding depth position from a top surface (a first surface) 10b of the wafer 10 and includes a plurality of modified areas R that are arranged one after another at corresponding constant intervals d1-d3 in a direction parallel to the top surface 10b and the back surface (a second surface) 10a of the wafer 10.

Similar to the previously proposed wafer 50, the modified area groups Ga-Gc, which are provided in layers, are arranged one after another at predetermined intervals in a depth direction of the wafer 10 (i.e., the thickness direction of the wafer 10, the cross sectional direction of the wafer 10, the vertical direction that is vertical to the top and back surfaces 10b, 10a of the wafer 10, the top-to-bottom direction of the wafer 10), which is perpendicular to and is directed from the top surface 10b of the wafer 10.

In the previously proposed wafer 50, at the time of forming the modified area groups Ga-Gc, each of the relative moving speed s of the focal point P of the laser beam L and the pulse oscillation frequency f of the laser beam L is set to the corresponding constant value, and the intervals d of the modified areas R of each modified area group Ga-Gc are all set to be generally identical to one another.

In contrast, according to the first embodiment, different intervals d1-d3 of the modified areas R are used in the modified area groups Ga-Gc. Specifically, the interval d1 in the lowermost layer of the modified area group Ga is set to be largest, and the interval d3 in the uppermost layer of the modified area group Gc is set to be smallest, and so on (i.e., d1>d2>d3).

As described above, the intervals d1-d3 of the modified areas R of each modified area group Ga-Gc are set to be a value (d=s/f), which is obtained by dividing the relative moving speed s of the focal point of the laser beam L with respect to the wafer 10 (the scanning speed of the laser beam L or the moving speed of the wafer 10) by the pulse oscillation frequency (a pulse repetition frequency) f of the pulsed laser beam L.

Similar to the previously proposed technique, even in the first embodiment, the relative moving speed s of the focal point P of the laser beam L at the time of forming each modified area group Ga-Gc is set to a constant value.

However, in the first embodiment, although an output power W of the laser beam L is set to a constant value, different pulse oscillation frequencies f1-f3 of the laser beam L are used to form the modified area groups Ga-Gc, respectively. Specifically, the pulse oscillation frequency f1, which is used to form the lowermost layer of the modified area group Ga, is set to be lowest, and the pulse oscillation frequency f3, which is used to form uppermost layer of the modified area group Gc, is set to be highest, and so on (i.e., f1<f2<f3).

The output power W of the laser beam L is generally the same as a product of the energy E per pulse of the laser beam L multiplied by the pulse oscillation frequency f (W≈f×E).

Therefore, in the case where the output power W of the laser beam L is constant, the energy E per pulse of the laser beam L gets larger when the pulse oscillation frequency f gets lower.

It is difficult to form the normal modified areas R at the deep part (the deep location), which is deep from the top surface (the laser beam incident surface) 10b of the wafer 10, due to the following reason.

That is, in the wafer 10, which has the bonded SOI structure, due to a variation in the optical characteristics of each layer 51-53, the refractive index of the laser beam L varies according to the layer thickness and material of each layer 51-53.

Thus, at a boundary surface between the layer 51 and the layer 52 or between the layer 52 and the layer 53, a portion of the laser beam L is reflected. This reflected laser beam interferes with the newly impinging laser beam to cause cancellation between the reflected laser beam and the newly impinging laser beam. Therefore, at the deep part, which is deep from the top surface (the laser beam incident surface) 10b of the wafer 10, the energy of the laser beam L is significantly reduced.

As a result, at the deep part of the wafer 10, the energy of the laser beam L, which is required to cause the multiphoton absorption from the laser beam L, becomes insufficient, so that the formation of the modified areas R, which include the fused areas, becomes impossible.

However, in the first embodiment, the pulse oscillation frequency f is set to be reduced as the depth in the wafer 10 from the top surface 10b of the wafer 10 gets deeper.

Therefore, in the case where the output power W of the laser beam L is set to be constant regardless of the depth of the focal point P, the energy E per pulse of the laser beam L gets larger as the depth from the top surface 10b of the wafer 10 gets deeper.

As a result, regardless of the reduction in the energy of the laser beam caused by the interference and the cancellation between the reflected laser beam and the impinging laser beam, the required energy of the laser beam L, which is required to cause the multiphoton absorption, can be achieved even at the deep part, which is deep from the top surface 10b of the wafer 10. As a result, the normal modified areas R, which include the fused areas, can be reliably made.

Therefore, in the first embodiment, the sufficient output power W of the laser beam L, which is required to form the modified areas R that constitute the modified area group Gc of the uppermost layer, is experimentally obtained.

Then, in the state where the thus obtained output power W is fixed, the pulse oscillation frequency f of the laser beam L is adjusted such that the pulse oscillation frequency f of the laser beam L gets lower as the depth in the wafer 10 measured from the top surface 10b of the wafer 10 gets greater, so that the multiple modified area groups Ga-Gc are sequentially and appropriately formed in the wafer 10.

In the wafer 10, which has the modified areas R that constitute the modified area groups Ga-Gc and are formed normally, the generation of unnecessary cracks is limited at the time of cutting and dividing the wafer 10. Therefore, the wafer 10 can be relatively accurately cut along the predetermined cutting lines. As a result, the yield and the quality of the chips, which are cut from the wafer 10, can be improved.

In the first embodiment, the optimum pulse oscillation frequencies f1-f3 at the time of forming the modifier area groups Ga-Gc (intervals d1-d3 of the modified areas R, which constitute the modified area groups Ga-Gc) may be experimentally determined through cut-and-try to achieve the above effects and advantages.

As discussed above, in the case where the relative moving speed s of the focal point P is constant, the interval d of the modified areas R gets larger as the pulse oscillation frequency f of the laser beam L gets lower.

Thus, in the case where the interval d of the modified areas R, which constitute the modifier area group at the corresponding depth, is increased as the depth in the wafer 10 from the top surface 10b of the wafer 10 becomes deeper, the pulse oscillation frequency f used at the time of forming the modified area group at the corresponding depth becomes lower at the deeper depth.

Therefore, by actually measuring the interval d of the modified areas R, which constitute the corresponding layer of the modified area group, it is possible to check whether the pulse oscillation frequency f of the laser beam L is fixed to the constant value like in the previously proposed technique or is varied like in the first embodiment. As a result, it is possible to easily determine whether any third part infringes the technique of the first embodiment.

In the state where the pulse oscillation frequency f of the laser beam L is fixed, it is conceivable that the output power W of the laser beam L is set to become larger as the depth from the top surface 10b of the wafer 10 becomes deeper to form the layers of the modified area groups Ga-Gc one after another.

Figure 2:
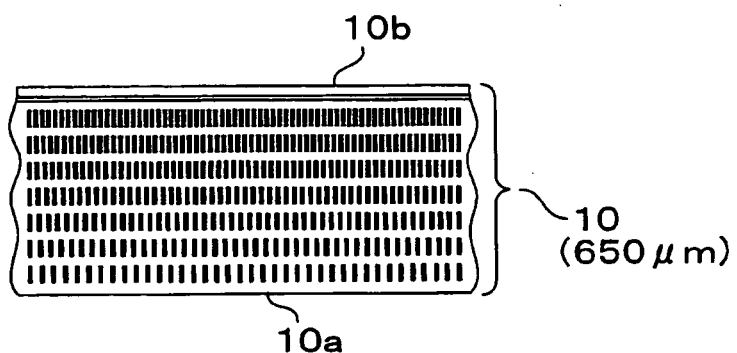
FIG. 2 is a diagram that schematically shows the longitudinal cross section of the wafer, in which layers of modified area groups are formed.

However, this method results in an increase in the power consumption of the laser processing machine, so that the manufacturing costs at the time of cutting and dividing the wafer 10 will be disadvantageously increased in comparison to the first embodiment, FIG. 2 schematically shows the longitudinal cross section of the wafer 10, in which the layers of the modified area groups are formed.

In the example of FIG. 2, at the time of forming the uppermost layer (the most shallow layer) of the modified area group, which is closest to the top surface 10b of the wafer 10, the pulse oscillation frequency f of the laser beam L is set to be high, and the interval d of the modified areas R is set to be small (narrow).

Furthermore, at the time of forming the lowermost layer (the deepest layer) of the modified area group, which is farthest from the top surface 10b of the wafer 10, the pulse oscillation frequency f of the laser beam L is set to be low, and the interval d of the modified areas R is set to be large (wide).

At the time of forming the intermediate layers of modified area groups, which are located between the uppermost layer and the lowermost layer, the pulse oscillation frequency f of the laser beam L is set to progressively increase from the lower layer toward the upper layer, so that the interval d of the modified areas R is progressively reduced.

As a result, in the case of FIG. 2, the modified areas R, which constitute the layers of the modified area groups, are formed normally from the top surface (the laser beam incident surface) 10b to the back surface 10a of the wafer 10.

Second Embodiment

Figure 3:
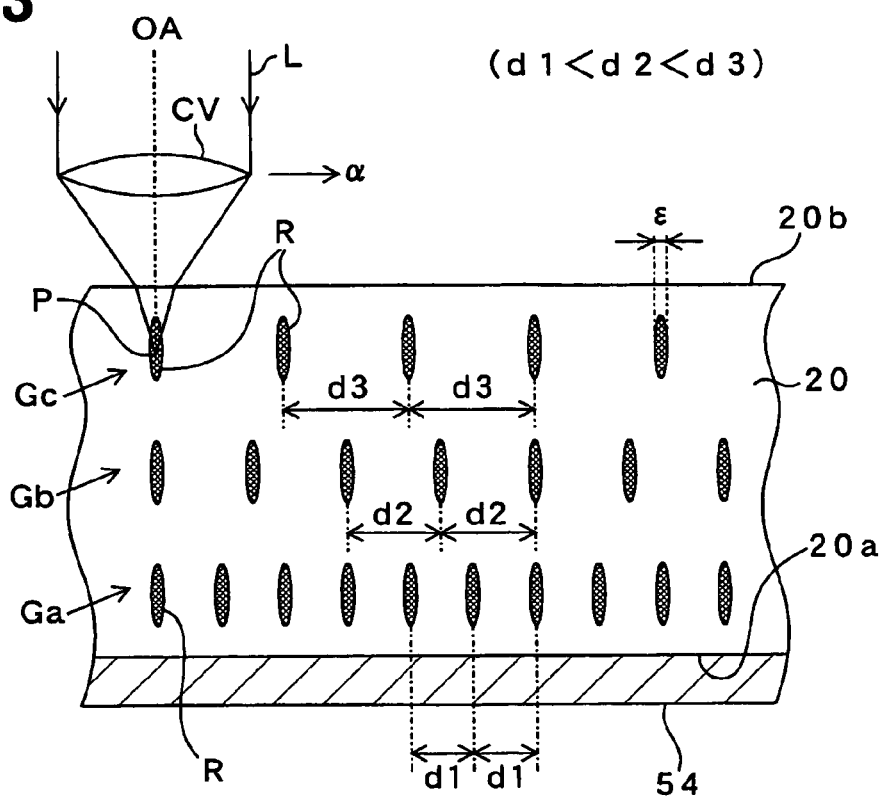
FIG. 3 is a descriptive view, which schematically shows a longitudinal cross sectional area of a wafer of a second embodiment for describing a way of forming modified areas in the wafer by applying a laser beam to the wafer.

FIG. 3 is a descriptive view, which schematically shows a longitudinal cross sectional area of a wafer 20 to describe the way of forming modified areas by applying the laser beam to the wafer 20 according to a second embodiment of the present invention.

The wafer 20 is a wafer (a bulk silicon wafer), which is made from a single crystal silicon bulk material (a bulk silicon wafer).

A dicing film 54 is bonded to a back surface 20a of the wafer 20.

Similar to the previously proposed wafer 50, the wafer 20 includes a plurality of modified area groups Ga-Gc, each of which is located at a predetermined corresponding depth position from a top surface (a first surface) 20b of the wafer 20 and includes a plurality of modified areas R that are arranged one after another at predetermined intervals d1-d3 in a direction parallel to the top surface 20b and the back surface (a second surface) 20a of the wafer 20.

Similar to the previously proposed wafer 50, the modified area groups Ga-Gc, which are provided in layers, are arranged one after another at predetermined intervals in a depth direction of the wafer 20 (i.e., the thickness direction of the wafer 20, the cross sectional direction of the wafer 20, the vertical direction that is vertical to the top and back surfaces 20b, 20a of the wafer 20, the top-to-bottom direction of the wafer 20), which is perpendicular to and is directed from the top surface 20b of the wafer 20.

According to the second embodiment, the intervals d1-d3 of the modified areas R of the modified area groups Ga-Gc differ from one another. Specifically, the interval d1 of the modified area group Ga, which is in the lowermost layer, is set to be smallest, and the interval d3 of the modified area group Gc, which is in the uppermost layer, is set to be largest, and so on (i.e., d1<d2<d3).

According to the second embodiment, in order to set the intervals d1-d3 of the modified areas R in the modified area groups Ga-Gc, at least one of the relative moving speed s of the focal point P and the pulse oscillation frequency f of the laser beam L is changed at the time of forming the modified area groups Ga-Gc.

For example, different relative moving speeds s1-s3 of the focal point P may be set to form the modified area groups Ga-Gc. Specifically, the relative moving speed s1 at the time of forming the lowermost layer of the modified area group Ga may be set to be the lowest, and the relative moving speed s3 at the time of forming the uppermost layer of the modified area group Gc may be set to be the highest, and so on (s1<s2<s3).

Furthermore, different pulse oscillation frequencies f1-f3 of the laser beam L may be used to form the modified area groups Ga-Gc. The pulse oscillation frequency f1, which is used at the time of forming the lowermost layer of the modified areas Ga, may be set to be highest, and the pulse oscillation frequency f3, which is used at the time of forming the uppermost layer of the modified areas Gc, may be set to be lowest, and so on (f1>f2>f3).

The relative moving speeds s1-s3 of the focal point P and the pulse oscillation frequencies f1-f3 of the laser beam L may be set as follows at the time of forming the modified area groups Ga-Gc to satisfy the above size relationship (d1<d2<3) of the intervals d1-d3 of the modified areas R in the modified area groups Ga-Gc.

(1) s1<s2<s3 and f1>f2>f3
(2) s1>s2>s3 and f1>f2>f3
(3) s1<s2<s3 and f1<f2<f3

As described above, at the time of cutting and dividing the wafer 20, the multiple layers of the modified area groups Ga-Gc are formed in the interior of the wafer 20, and then the dicing film 54 is stretched in the horizontal direction with respect to the respective predetermined cutting line to apply the stretching stress to the modified area groups Ga-Gc.

In the case of FIG. 3, the dicing film 54 is stretched in the direction perpendicular to the plane of FIG. 3.

Thus, the shearing stress is generated in the interior of the wafer 20. As a result, a crack (break) is generated in the depth direction of the wafer 20 from the lowermost layer of the modified area group Ga, which is closest to the dicing film 54 and serves as a crack start point. Then, another crack is generated in the depth direction of the wafer 20 from the intermediate layer of the modified area group Gb, which serves as a crack start point. Thereafter, the crack is generated in the depth direction of the wafer 20 from the uppermost layer of the modified area group Gc, which serves as a crack start point. These cracks grow further and are connected to each other. When the grown cracks reach the top and back surfaces 20b, 20a of the wafer 20, the wafer 20 is cut and is divided.

As described above, the start point for cutting the wafer 20 is the lowermost layer of the modified area group Ga, to which the stretching stress is applied first from the dicing film 54.

Thus, in order to relatively accurately cut and divide the wafer 20 with the relatively small force without forming the unnecessary cracks in the wafer 20, it is required to generate the crack initially in the modified area group Ga, which serves as the crack start point, and then to generate the cracks in the modified area groups Gb, Gc, which serve as the crack start points.

In the second embodiment, the intervals d of the modified areas R, which form the modified area groups, are set to get smaller as the depth from the top surface 20b of the wafer 20 gets deeper. Therefore, the interval d1 in the lowermost layer of the modified area group Ga becomes smallest.

Therefore, according to the second embodiment, when the stretching stress is applied to the wafer 20 from the dicing film 54, the crack is initially, immediately generated in the lowermost layer of the modified area group Ga, and then the cracks grow smoothly from the lowermost layer of the modified area group Ga toward the uppermost layer of the modified area group Gc. As a result, the wafer 20 can be relatively accurately cut and divided, and thereby the yield and quality of the chips, which are formed by cutting and dividing the wafer 20, can be improved.

In an illustrative instance where the interval d in each modified area group Ga-Gc is set to be smaller than the left-to-right width ε of the modified area R, which is measured in the direction parallel to the top surface 20b and the back surface 20a of the wafer 20, the adjacent modified areas R overlap with each other, so that each modified area group Ga-Gc is formed by the single continuous modified area R.

In such a case, the overlapped parts of the adjacent modified areas R are molten and recrystallized to increase its mechanical strength, so that the generation of the crack in each modified area group Ga-Gc may be disadvantageously limited.

As a result, in the second embodiment, each interval d1-d3 of the modified areas R in each of the modified area groups Ga-Gc should be found and set through the cut-and-try such that each interval d1-d3 is set in view of the left-to-right width ε of the corresponding modified area R in such a manner that the adjacent modified areas R do not form the overlapped parts.

Furthermore, it is conceivable to use a method, in which each interval d2, d3 of the modified areas R in each of the modified area groups Gb, Gc is set to a relatively small value, which is generally the same as the interval d1 of the modified areas R in the modified area group Ga.

However, in a case where the relative moving speeds s1-s3 of the focal point P used at the time of forming the modified area groups Ga-Gc are all set to be relatively low to implement this method, the time required to form the modified area groups Ga-Gc is lengthened in comparison to the second embodiment. As a result, the throughput is reduced, and thereby this is not suitable for the mass production.

Furthermore, in a case where the pulse oscillation frequencies f1-f3 of the laser beam L used at the time of forming the modified area groups Ga-Gc are all set to be relatively high to implement this method, the output power W of the laser beam L needs to be increased in comparison to the second embodiment to normally form the modified areas R of the lowermost layer of the modified area group Ga. Thus, the electric power consumption of the laser processing machine, which generates the laser beam L, is increased, and thereby the manufacturing cost for cutting the wafer 20 is disadvantageously increased.

Third Embodiment

Figure 4:
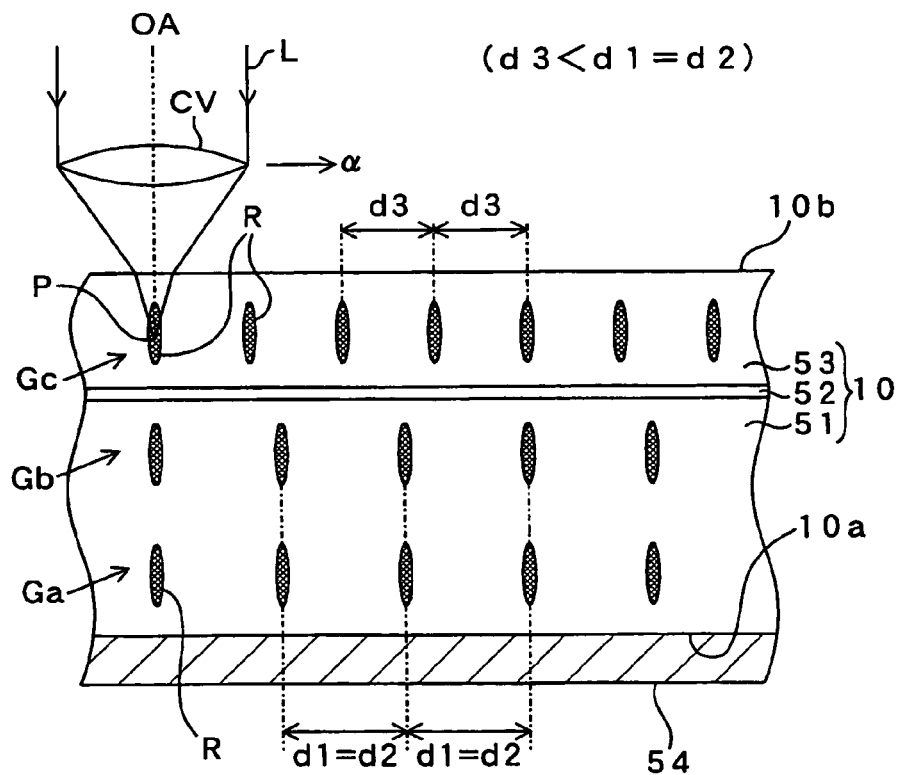
FIG. 4 is a descriptive view, which indicates a third embodiment that is a modification of the first embodiment and which schematically shows a longitudinal cross section of the wafer.

FIG. 4 is a descriptive view, which indicates a third embodiment that is a modification of the first embodiment and which schematically shows a longitudinal cross section of the wafer 10.

The wafer 10 of the third embodiment differs from the wafer 10 of the first embodiment shown in FIG. 1 in the following point. Specifically, in the third embodiment, the intervals d1, d2 of the modified areas R in the modified area groups Ga, Gb are generally identical to one another, and only the interval d3 of the modified areas R in the uppermost layer of the modified area group Gc is made smaller than the interval d1, d2 (i.e., d1=d2>d3).

In order to set the intervals d1-d3 of the modified areas R in the modified area groups Ga-Gc in the above described manner, while the output power W of the laser beam L is set to be constant, the pulse oscillation frequencies f1, f2 used to form the modified area groups Ga, Gb are set to be generally identical to one another, and only the pulse oscillation frequency f3 used to form the uppermost layer of the modified area group Gc is set to be higher that the pulse oscillation frequency f1, f2 (i.e., f1=f2<f3).

Specifically, in the first embodiment, as the depth from the top surface 10b of the wafer 10 gets deeper, the pulse oscillation frequency f used to form the modified area group at that depth gets progressively lower, and thereby the interval d of the modified areas R of the corresponding modified area group at that depth gets progressively larger.

This is due to the fact that the formation of the normal modified areas R gets more difficult as the depth from the top surface 10b of the wafer 10 gets deeper. Thus, in order to reliably form the modified areas R in that depth, the pulse oscillation frequency f is progressively reduced.

Alternatively, as in the third embodiment, the pulse oscillation frequency f used to form the modified area groups in the deep part of the wafer 10 may be set to be lower, so that the interval d1, d2 of each of the modified area groups Ga, Gb may be set to be larger than the interval d3 of the modified area group Gc. With respect to the shallow part of the wafer 10, which is shallow from the top surface 10b of the wafer 10, the pulse oscillation frequency f used to form the modified area group in the shallow part of the wafer 10 may be set to be higher, so that the interval d3 of the modified area group Gc in the shallow part may be set to be smaller than the interval d1, d2 of each of the modified area groups Ga, Gb.

Even when the intervals d1-d3 of the modified areas R in the modified area groups Ga-Gb are set in the above described manner like in the third embodiment, the effects and the advantages similar to those of the first embodiment can be achieved.

Figure 14:
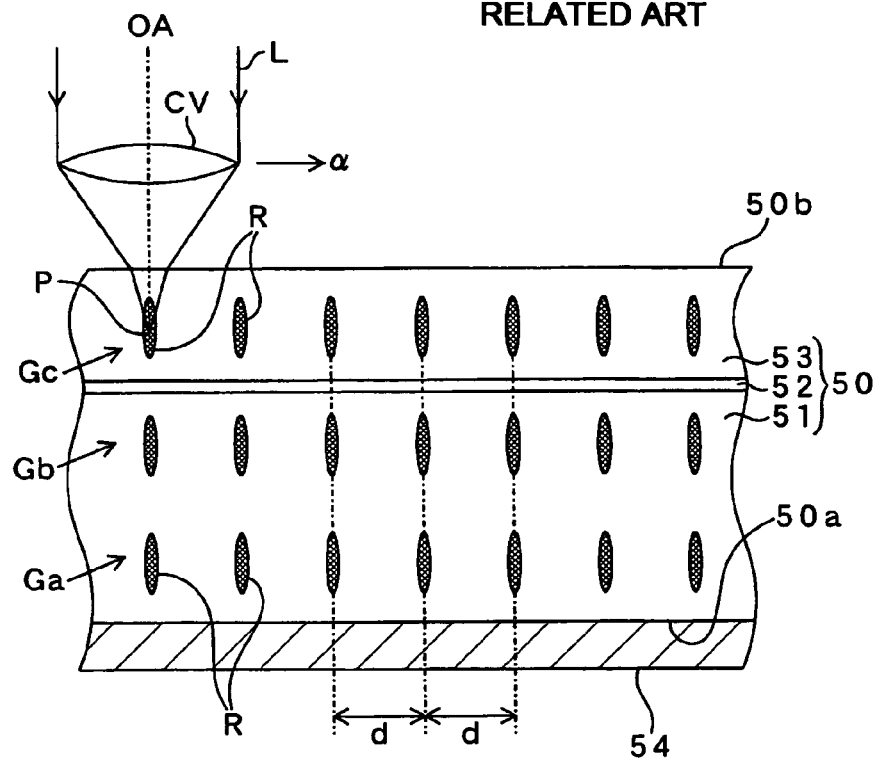
FIG. 14 is a descriptive view, which indicates a way of forming modified areas by applying a laser beam to a wafer having a bonded SOI structure according to a previously proposed technique and which schematically shows a longitudinal cross section of the wafer.
Figure 15:
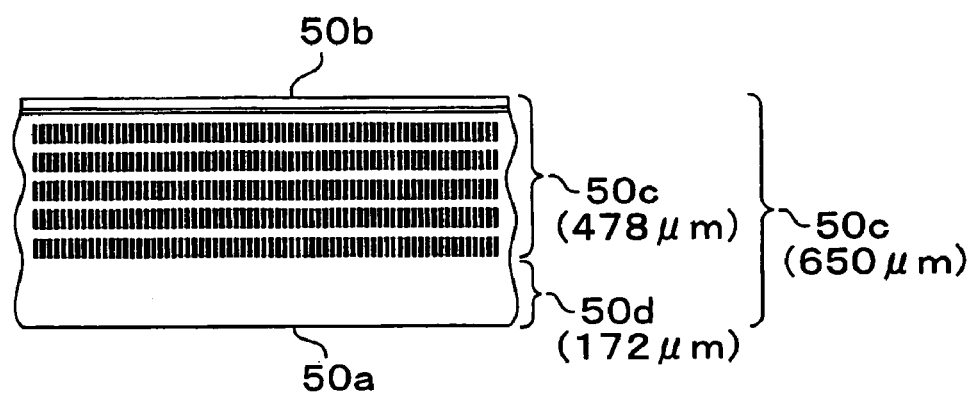
FIG. 15 is a diagram that schematically shows a longitudinal cross section of the wafer, in which layers of modified area groups are formed according to the previously proposed technique.

For example, in a case where the third embodiment is implemented in the related art shown in FIG. 14, only the pulse oscillation frequency f used to form the modified area group in the deep part 50d, at which the modified areas R are difficult to form, may be set to be lower, and thereby the interval d of the modified areas R in the modified area group in the deep part 50d (FIG. 15) may be set to be larger. In this way, similar to the shallow part 50c, the normal modified areas R can be reliably formed even in the deep part 50d.

Fourth Embodiment

Figure 5:
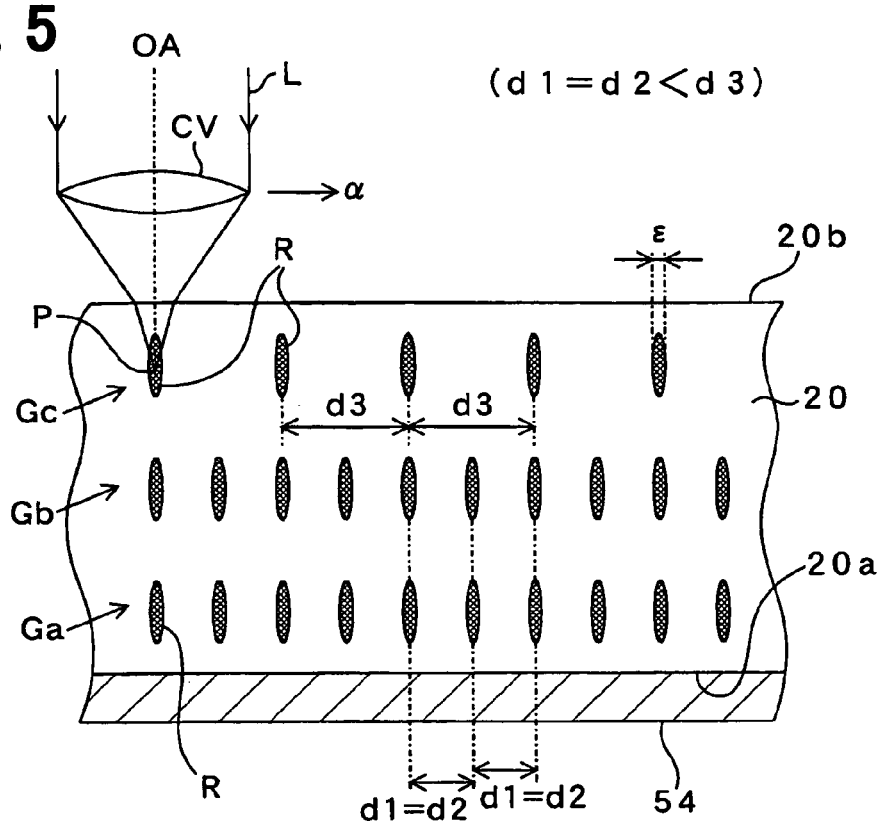
FIG. 5 is a descriptive view, which indicates a fourth embodiment that is a modification of the second embodiment and which schematically shows a longitudinal cross section of the wafer.

FIG. 5 is a descriptive view, which indicates a fourth embodiment that is a modification of the second embodiment and which schematically shows a longitudinal cross section of the wafer 20.

The wafer 20 of the fourth embodiment differs from the wafer 20 of the second embodiment shown in FIG. 3 in the following point. Specifically, in the fourth embodiment, the intervals d1, d2 of the modified areas R in the modified area groups Ga, Gb are set to be generally identical to one another, and only the interval d3 of the modified areas R in the uppermost layer of the modified area group Gc is set to be larger than the intervals d1, d2 (i.e., d1=d2<d3).

In the second embodiment, the interval d of the modified areas R is set to get progressively smaller as the depth from the top surface 20b of the wafer 20 gets deeper.

This is due to the following reason. That is, as the depth from the top surface 20d of the wafer 20 gets deeper, the stretching stress from the dicing film 54 is applied earlier. Therefore, by progressively reducing the interval d of the modified areas R as the depth gets deeper, the crack can be easily generated in the modified area group in the corresponding depth to ease the cutting and diving of the wafer 20.

Alternatively, as in the fourth embodiment, the interval d1, d2 of the modified areas R in each of the modified area groups Ga, Gb formed in the deep part, which is deep from the top surface 20b of the wafer 20, may be set smaller, and the interval d3 of the modified areas R in the modified area group Gc formed in the shallow part, which is shallow from the top surface 20b of the wafer 20, may be set larger.

Even when the intervals d1-d3 of the modified areas R in the modified area groups Ga-Gb are set in the above described manner like in the fourth embodiment, the effects and the advantages similar to those of the second embodiment can be achieved.

Fifth Embodiment

Figure 6:
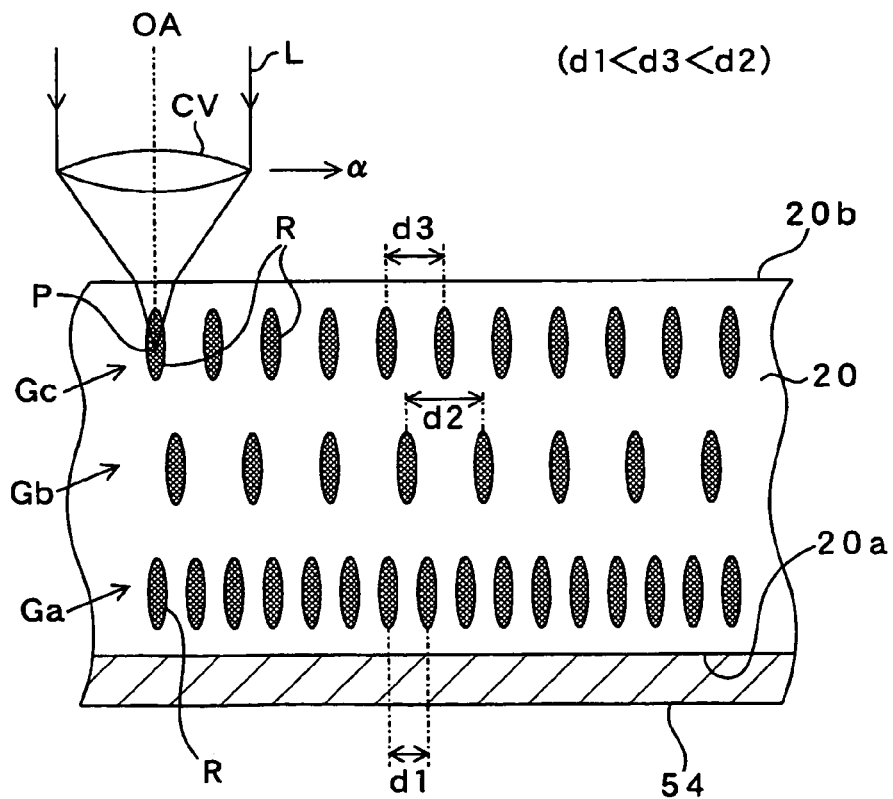
FIG. 6 is a descriptive view, which indicates a fifth embodiment that is a modification of the second embodiment and which schematically shows a longitudinal cross section of the wafer.

FIG. 6 is a descriptive view, which indicates a fifth embodiment that is a modification of the second embodiment and which schematically shows a longitudinal cross section of the wafer 20.

According to the fifth embodiment, the intervals d1-d3 of the modified areas R of the modified area groups Ga-Gc differ from one another. Specifically, the interval d1 of the modified area group Ga, which is in the lowermost layer, is set to be smallest, and the interval d2 of the modified area group Gb, which is in the intermediate layer, is set to be largest, and so on (i.e., d1<d3<d2).

The modified area groups Ga-Gc are arranged at predetermined intervals in the depth direction of the wafer 20.

Even when the intervals d1-d3 of the modified areas R in the modified area groups Ga-Gc are set according to the fifth embodiment, the distortion of the wafer 20, which is generated in the top and bottom sides of the modified area groups Ga-Gc at the time of cutting and dividing the wafer 20, changes. Thus, it is possible to relatively accurately cut and divide the wafer 20 to improve the cutting and dividing performance, and thereby the effects and the advantages similar to those of the second embodiment can be achieved.

Here, the top and bottom sides of each modified area group Ga-Gc refer to a top surface 20b side end and a back surface 20a side end of each modified area group Ga-Gc in the depth direction of the wafer 20.

Sixth Embodiment

Figure 7:
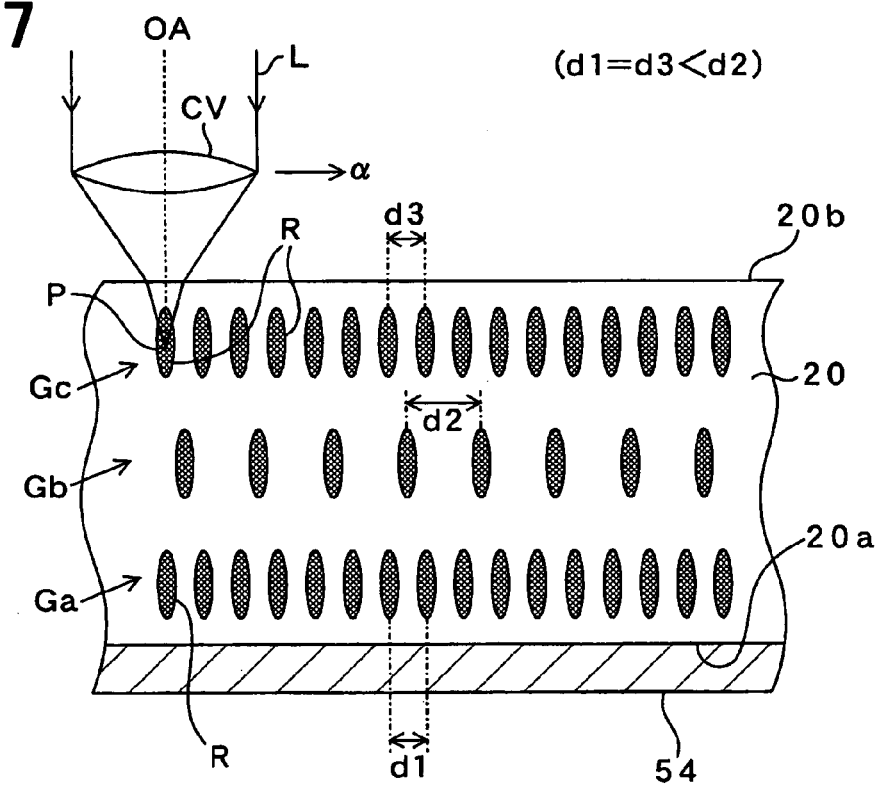
FIG. 7 is a descriptive view, which indicates a sixth embodiment that is a modification of the second embodiment and which schematically shows a longitudinal cross section of the wafer.

FIG. 7 is a descriptive view, which indicates a sixth embodiment that is a modification of the second embodiment and which schematically shows a longitudinal cross section of the wafer 20.

In the sixth embodiment, the intervals d1, d3 of the modified areas R in the modified area groups Ga, Gc are set to be generally identical to one another, and only the interval d2 of the modified areas R in the intermediate layer of the modified area group Gb is set to be larger than the intervals d1, d3 (i.e., d1=d3<d2).

The modified area groups Ga-Gc are arranged at predetermined intervals in the depth direction of the wafer 20.

Even when the intervals d1-d3 of the modified areas R in the modified area groups Ga-Gc are set in the above described manner like in the sixth embodiment, the effects and the advantages similar to those of the fifth embodiment can be achieved.

Seventh Embodiment

Figure 8:
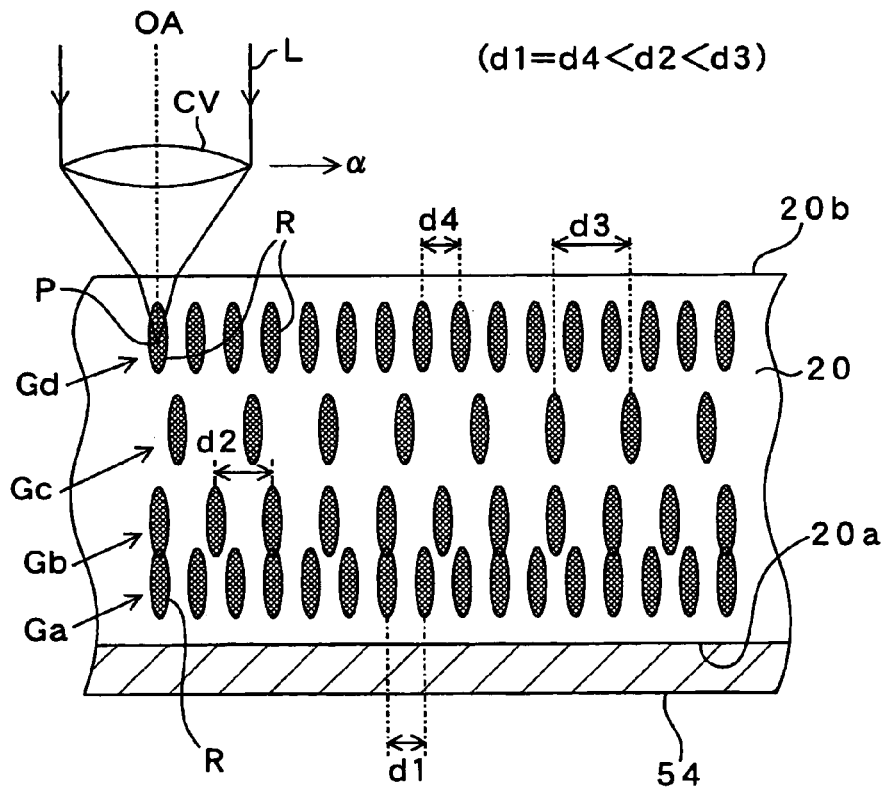
FIG. 8 is a descriptive view, which indicates a seventh embodiment that is a modification of the second embodiment and which schematically shows a longitudinal cross section of the wafer.

FIG. 8 is a descriptive view, which indicates a seventh embodiment that is a modification of the second embodiment and which schematically shows a longitudinal cross section of the wafer 20.

In the seventh embodiment, four layers of modified area groups Ga-Gd are arranged at corresponding depth positions, respectively, with respect to the top surface 20b of the wafer 20. In each of the four layers of the modified area groups Ga-Gd, modified areas R are arranged at corresponding constant intervals d1-d4 in the direction that is parallel to the top and back surfaces 20b, 20a of the wafer 20.

In the seventh embodiment, the intervals d1, d4 of the modified areas R in the modified area groups Ga, Gd are set to be generally identical to one another, and the interval d2 of the modified areas R in the second layer of the modified area group Gb is set to be larger than the intervals d1, d4, and the interval d3 of the modified areas R in the third layer of the modified area group Gc is set to be the largest (d1=d4<d2<d3).

Even when the intervals d1-d4 of the modified areas R in the modified area groups Ga-Gd are set according to the seventh embodiment, the effects and the advantages similar to those of the fifth embodiment can be achieved.

Furthermore, in the seventh embodiment, the modified area groups Ga, Gb (depth extents of the modified area groups Ga, Gb) partially overlap with each other in the depth direction of the wafer 20, and the modified area groups Gb-Gd (depth extents of the modified area groups Gb-Gd) are spaced from one another in the depth direction of the wafer 20.

As in the seventh embodiment, even when the modified area groups Ga-Gd are partially overlapped or are spaced from one another, i.e., even when a depth extent (vertical extent in FIG. 8) of each modified area R in one of the modified area groups Ga-Gd is overlapped with or is adjacent to or is spaced from a depth extent of a closest one of the modified areas R of an adjacent one of the modified area groups Ga-Gd, the cracks, which are respectively started in the modified area groups Ga-Gd, can be connected to one another at the time of the cutting and dividing the wafer 20, and thereby the effects and the advantages similar to those of the second embodiment can be achieved.

Furthermore, in order to set the locations of the modified area groups Ga-Gd in the depth direction of the wafer 20, each depth position of the focal point P in the interior of the wafer 20 may be appropriately set through use of the above methods (I)-(III).

Eighth Embodiment

Figure 9:
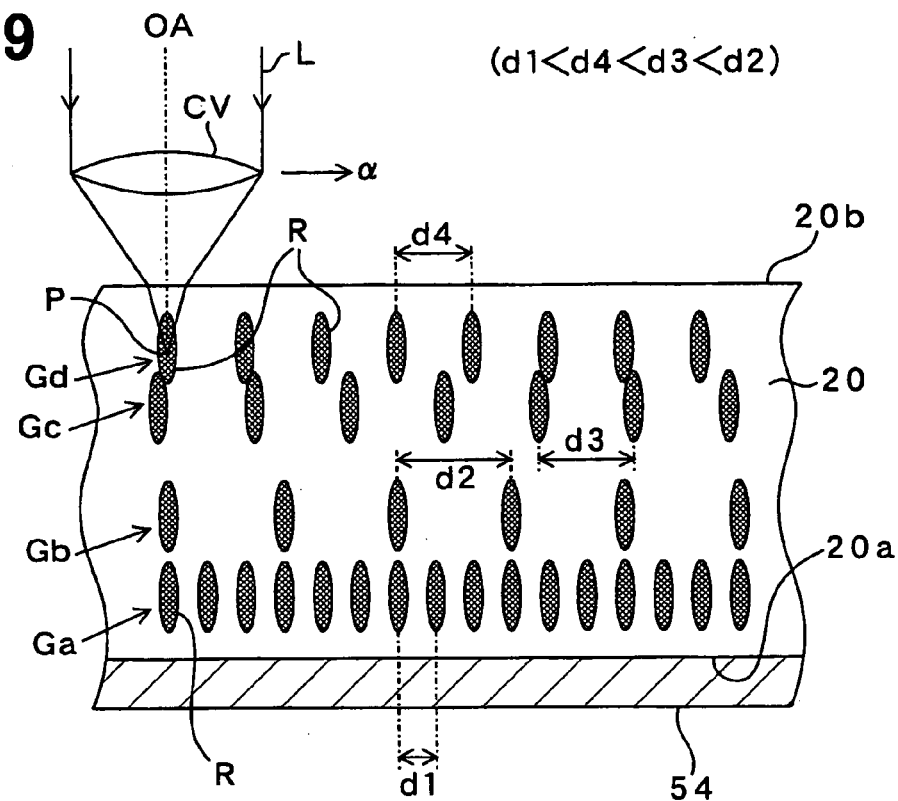
FIG. 9 is a descriptive view, which indicates an eighth embodiment that is a modification of the second embodiment and which schematically shows a longitudinal cross section of the wafer.

FIG. 9 is a descriptive view, which indicates an eighth embodiment that is a modification of the second embodiment and which schematically shows a longitudinal cross section of the wafer 20.

According to the eighth embodiment, the intervals d1-d4 of the modified areas R of the modified area groups Ga-Gd differ from one another. Specifically, the interval d1 of the modified area group Ga, which is in the lowermost layer, is set to be smallest, and the interval d2 of the modified area group Gb, which is in the second layer, is set to be largest, and the interval d4 of the modified area group Gd, which is in the uppermost layer, is set to be second smallest, and the interval d3 of the modified area group Gc, which is in the third layer, is set to be third smallest (i.e., d1<d4<d3<d2).

Even when the intervals d1-d4 of the modified areas R in the modified area groups Ga-Gd are set in the above described manner like in the eighth embodiment, the effects and the advantages similar to those of the fifth embodiment can be achieved.

Furthermore, in the eighth embodiment, the modified area groups Ga, Gb (depth extents of the modified area groups Ga, Gb) are adjacent to each other in the depth direction of the wafer 20. Also, the modified area groups Gc, Gd (depth extents of the modified area groups Gc, Gd) are partially overlapped with each other in the depth direction of the wafer 20. Furthermore, the modified area groups Gb, Gc (depth extents of the modified area groups Gb, Gc) are spaced from each other in the depth direction of the wafer 20.

As in the eighth embodiment, even when the modified area groups Ga-Gd are placed adjacent to one another or are partially overlapped with one another or are spaced from one another in the depth direction of the wafer 20, the effects and advantages similar to those of the seventh embodiment can be achieved.

Ninth Embodiment

Figure 10:
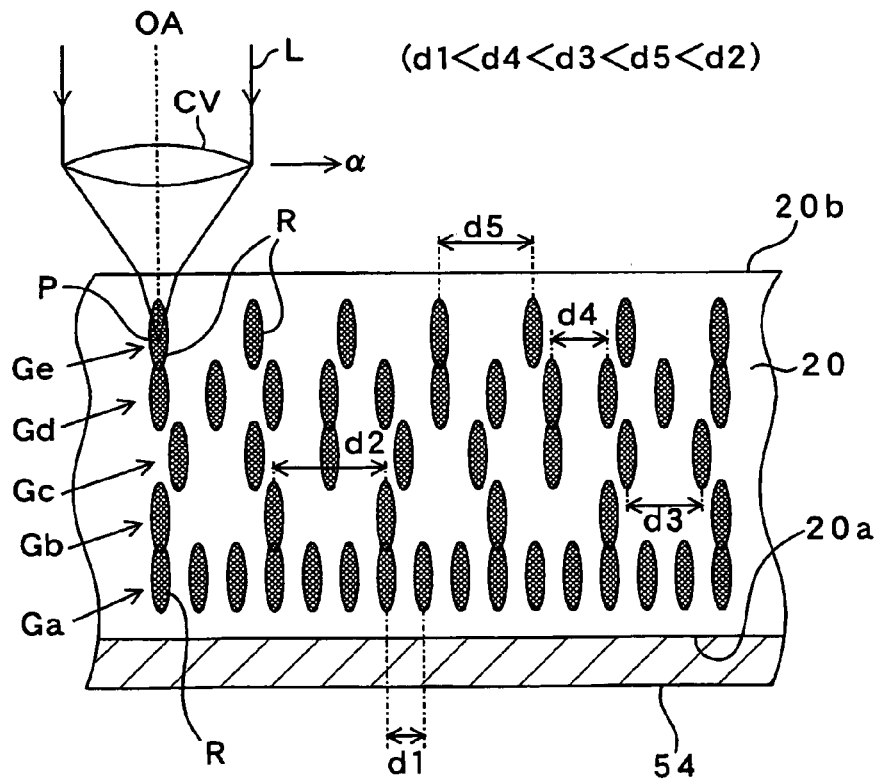
FIG. 10 is a descriptive view, which indicates a ninth embodiment that is a modification of the second embodiment and which schematically shows a longitudinal cross section of the wafer.

FIG. 10 is a descriptive view, which indicates a ninth embodiment that is a modification of the second embodiment and which schematically shows a longitudinal cross section of the wafer 20.

In the ninth embodiment, five layers of modified area groups Ga-Ge are arranged at corresponding depth positions, respectively, from the top surface 20b of the wafer 20. In each of the five layers of the modified area groups Ga-Ge, modified areas R are arranged at corresponding constant intervals d1-d5 in the direction that is parallel to the top and back surfaces 20b, 20a of the wafer 20.

According to the ninth embodiment, the intervals d1-d5 of the modified areas R of the modified area groups Ga-Ge differ from one another. Specifically, the interval d1 of the modified area group Ga, which is in the lowermost layer, is set to be smallest. The interval d2 of the modified area group Gb, which is in the second layer, is set to be largest. The interval d4 of the modified area group Gd, which is in the fourth layer, is set to be second smallest. The interval d3 of the modified area group Gc, which is in the third layer, is set to be third smallest. The interval d5 of the modified area group Ge, which is in the uppermost layer, is set to be second largest (i.e., $d1<d4<d3<d5<d2$).

Even when the intervals d1-d5 of the modified areas R in the modified area groups Ga-Ge are set in the above described manner like in the ninth embodiment, the effects and the advantages similar to those of the fifth embodiment can be achieved.

In the ninth embodiment, the modified area groups Ga-Ge (depth extents of the modified area groups Ga-Ge) are partially overlapped with one another in the depth direction of the wafer 20.

As in the ninth embodiment, even when the modified area groups Ga-Ge are partially overlapped with one another in the depth direction of the wafer 20, the effects and advantages similar to those of the seventh embodiment can be achieved.

Tenth Embodiment

Figure 11:
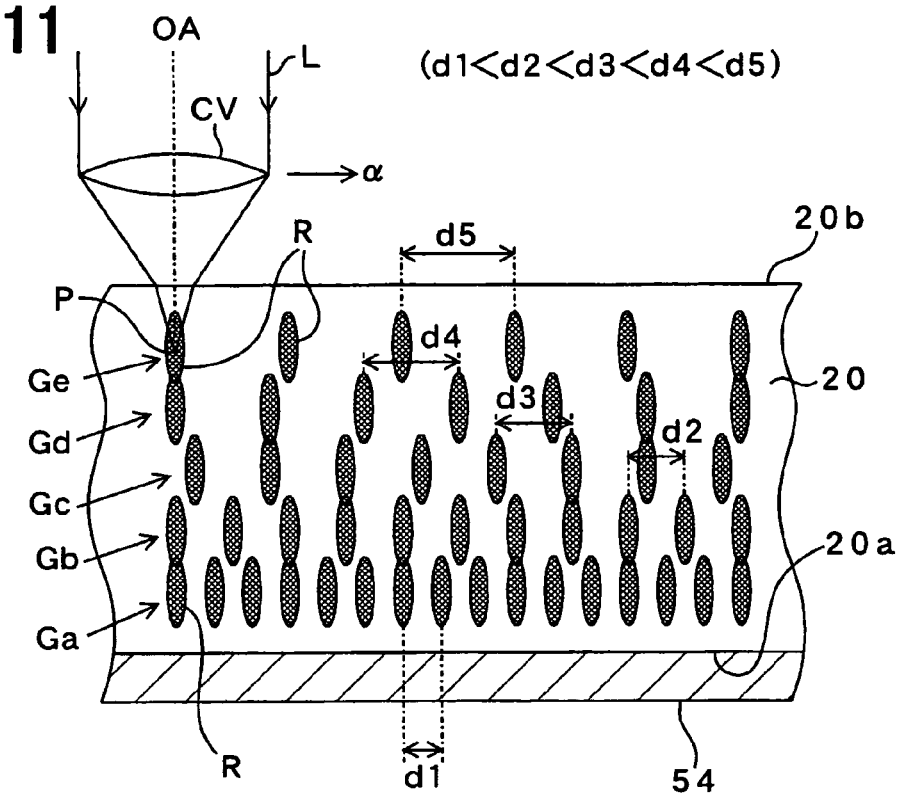
FIG. 11 is a descriptive view, which indicates a tenth embodiment that is a modification of the second embodiment and which schematically shows a longitudinal cross section of the wafer.

FIG. 11 is a descriptive view, which indicates a tenth embodiment that is a modification of the second embodiment and which schematically shows a longitudinal cross section of the wafer 20.

According to the tenth embodiment, the intervals d1-d5 of the modified areas R of the modified area groups Ga-Ge differ from one another. Specifically, the interval d1 of the modified area group Ga, which is in the lowermost layer, is set to be smallest. The interval d5 of the modified area group Ge, which is in the uppermost layer, is set to be largest. The interval d2 of the modified area group Gb, which is in the second layer, is set to be second smallest. The interval d3 of the modified area group Gc, which is in the third layer, is set to be third smallest. The interval d4 of the modified area group Gd, which is in the fourth layer, is set to be second largest (i.e., $d1<d2<d3<d4<d5$).

Even when the intervals d1-d5 of the modified areas R in the modified area groups Ga-Ge are set in the above described manner like in the tenth embodiment, the effects and the advantages similar to those of the fifth embodiment can be achieved.

In the tenth embodiment, the modified area groups Ga-Ge (depth extents of the modified area groups Ga-Ge) are partially overlapped with one another in the depth direction of the wafer 20.

As in the tenth embodiment, even when the modified area groups Ga-Ge are partially overlapped with one another in the depth direction of the wafer 20, the effects and advantages similar to those of the seventh embodiment can be achieved.

Eleventh Embodiment

Figure 12:
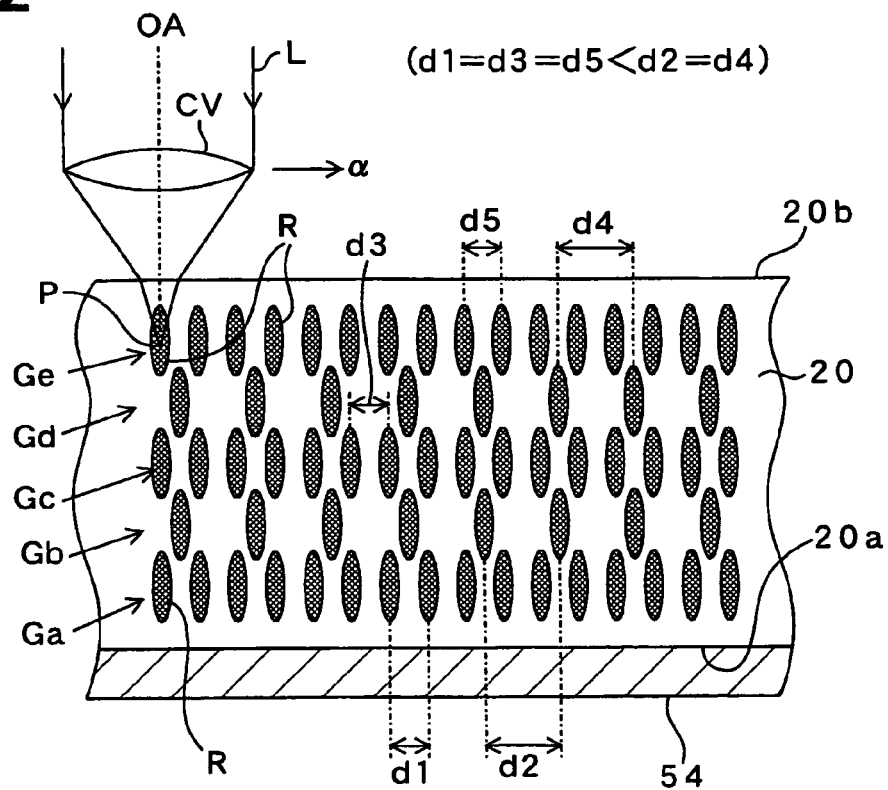
FIG. 12 is a descriptive view, which indicates an eleventh embodiment that is a modification of the second embodiment and which schematically shows a longitudinal cross section of the wafer.

FIG. 12 is a descriptive view, which indicates an eleventh embodiment that is a modification of the second embodiment and which schematically shows a longitudinal cross section of the wafer 20.

In the eleventh embodiment, the intervals d1, d3, d5 of the modified areas R in the modified area groups Ga, Gc, Ge are set to be generally identical to one another, and the intervals d2, d4 of the modified areas R in the modified area groups Gb, Gd are set to be generally identical to one another, and the intervals d2, d4 are set to be larger than the intervals d1, d3, d5 (i.e., $d1=d3=d5<d2=d4$).

Even when the intervals d1-d5 of the modified areas R in the modified area groups Ga-Ge are set in the above described manner like in the eleventh embodiment, the effects and the advantages similar to those of the fifth embodiment can be achieved.

In the eleventh embodiment, the modified area groups Ga-Ge (depth extents of the modified area groups Ga-Ge) are partially overlapped with one another in the depth direction of the wafer 20.

As in the eleventh embodiment, even when the modified area groups Ga-Ge are partially overlapped with one another in the depth direction of the wafer 20, the effects and advantages similar to those of the seventh embodiment can be achieved.

Twelfth Embodiment

Figure 13:
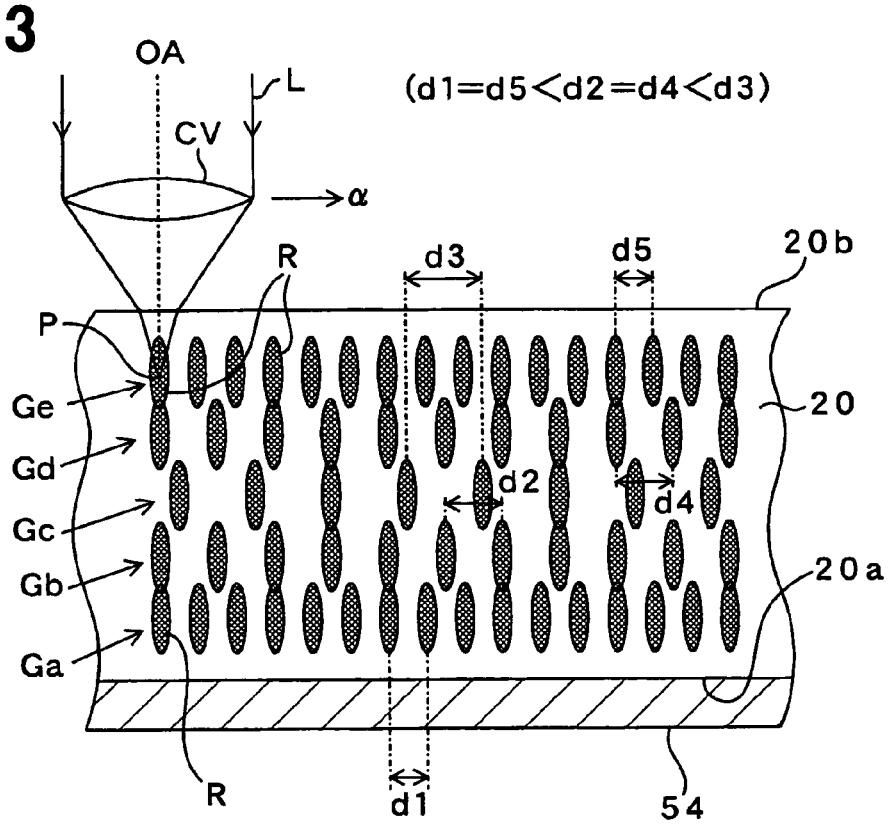
FIG. 13 is a descriptive view, which indicates a twelfth embodiment that is a modification of the second embodiment and which schematically shows a longitudinal cross section of the wafer.

FIG. 13 is a descriptive view, which indicates a twelfth embodiment that is a modification of the second embodiment and which schematically shows a longitudinal cross section of the wafer 20.

In the twelfth embodiment, the intervals d1, d5 of the modified areas R in the modified area groups Ga, Ge are set to be generally identical to one another, and the intervals d2, d4 of the modified areas R in the modified area groups Gb, Gd are set to be generally identical to one another, and the intervals d2, d4 are set to be larger than the intervals d1, d5, and the interval d3 of the modified areas R in the modified area group Gc, which is in the third layer, is set to be largest (i.e., $d1=d5<d2=d4<d3$).

Even when the intervals d1-d5 of the modified areas R in the modified area groups Ga-Ge are set in the above described manner like in the twelfth embodiment, the effects and the advantages similar to those of the fifth embodiment can be achieved.

In the twelfth embodiment, the modified area groups Ga-Ge (depth extents of the modified area groups Ga-Ge) are partially overlapped with one another in the depth direction of the wafer 20.

As in the twelfth embodiment, even when the modified area groups Ga-Ge are partially overlapped with one another in the depth direction of the wafer 20, the effects and the advantages similar to those of the seventh embodiment can be achieved.

MODIFICATIONS

The present invention is not limited to the above embodiments. For example, the above embodiments can be modified in the following manner. Even in the following modifications, the effects and the advantages similar to those of the above embodiments can achieved.

(1) The three layers of the modified area groups Ga-Gc are provided in the first to sixth embodiments, and the four layers of the modified area groups Ga-Gd are provided in the seventh and eighth embodiments, and the five layers of the modified area groups Ga-Ge are provided in the ninth to twelfth embodiments.

However, the number of the layers of the modified area groups may be set in any other appropriate manner according to the plate thickness of the wafer 10, 20 and may be set to be equal to or less than two or may be set to be equal to or greater than six.

(2) The four to twelfth embodiments are the modifications of the second embodiment. However, the present invention is not limited to the second and fourth to twelfth embodiments. For example, the intervals d1-d5 of the modified areas R in the modified area groups Ga-Ge may be set in such a manner that the intervals d1-d5 progressively increase as the depth from the top surface 20b of the wafer 20 gets deeper. Alternatively, the intervals d1-d5 of the modified areas R in the modified area groups Ga-Ge may be set in such a manner that a relatively large interval and a relatively small interval are alternately arranged in the depth direction of the wafer 20. Further alternatively, the intervals d1-d5 of the modified areas R in the modified area groups Ga-Ge may be set at random in depth direction of the wafer 20.

For example, the layers of the modified area groups, which have the generally identical intervals of the modified areas, may be provided one after another. Specifically, in a case where seven layers of modified area groups are provided, the lowermost layer of the modified area group to the fourth lowermost layer of the modified area group may have the generally identical intervals of the modified areas, and the fifth lowermost layer of the modified area group to the top layer of the modified area group may have the progressively increasing intervals of the modified areas.

Specifically, the intervals of the modified areas in at least one of the multiple layers of the modified area groups may differ from the intervals of the modified areas in the other one or more of the multiple layers of the modified area groups. Even in such a case, the effects and the advantages similar to those of the fifth embodiment can be achieved.

Furthermore, the interval of the modified areas in each of the modified area groups may be experimentally set to the best value through the cut-and-try in a manner that enables the above effects and the advantages.

(3) Apart from the second and fourth to twelfth embodiments, the layers of the modified area groups Ga-Ge (depth extents of the modified area groups Ga-Ge), which are arranged one after another in the depth direction of the wafer 20, may be appropriately spaced from one another or may be placed adjacent to one another or may be partially overlapped with one another. Even in this way, the effects and the advantages similar to those of the seventh embodiment can be achieved.

In the case where the modified area groups (depth extents of the modified area groups) are spaced from one another, each interval between the modified area groups may be experimentally set through the cut-and-try according to the intervals of the modified areas in the corresponding modified area groups in a manner that achieves the above effects and the advantages. Furthermore, the intervals of the modified area groups may be changed from one layer of modified area group to another layer of modified area group.

Also, it is possible to experimentally set how the modified area groups are spaced from one another or are placed adjacent to one another or are overlapped with one another through the cut-and-try according to the intervals of the modified areas in the corresponding modified area groups in a manner that achieves the above effects and advantages.

(4) The interval of the modified areas in at least one of the layers of the modified area groups may differ from that of the other one or more of the layers of the modified area groups in the first embodiment like in the above section (2).

Furthermore, even in the first embodiment, similar to the above section (3), the layers of the modified area groups, which are arranged one after another in the depth direction from the top surface 20b of the wafer 20 may be appropriately spaced from one another or may be appropriately placed adjacent to one another or may be appropriately overlapped with one another.

(5) In the first embodiment, the present invention is implemented in the wafer 10, which has the bonded SOI structure. However, the present invention is not limited to this. Specifically, the present invention may be implemented in any other suitable wafer(s), which is made of, for example, a semiconductor material for forming a semiconductor substrate that has a multilayer structure.

In such a case, the wafer may be a wafer having an SIMOX structure. Alternatively, the wafer may be a wafer having an SOI structure, in which a polycrystal silicon or an amorphous silicon is formed on an insulated substrate, such as an insulated glass substrate, through a solid phase epitaxy process or a melt-recrystallization process. Further alternatively, the wafer may be a wafer used in a semiconductor light emitting element, which is produced through a crystal growth process for growing a III-V family chemical compound semiconductor layer on a substrate, such as a sapphire substrate. Further alternatively, the wafer may be a wafer, which is formed by bonding a silicon substrate and a glass substrate together through an anodic bonding process.

(6) In each of the above embodiments, the present invention is implemented in the wafer 10, 20, which is made of the single crystal silicon used in the manufacturing of the single crystal silicon substrate. However, the present invention is not limited to this. For example, the present invention may be implemented in any other suitable wafer as long as the wafer is made of a semiconductor material (e.g., gallium arsenide) used in the manufacturing of a semiconductor substrate (e.g., a gallium arsenide substrate).

For example, in the second and fourth to twelfth embodiments, the present invention is implemented in the bulk silicon wafer. However, the present invention may be implemented in a semiconductor wafer, which is made of a bulk material of any semiconductor (a semiconductor bulk material).

Furthermore, the present invention is not limited to the wafer made of the semiconductor material used in the manufacturing of the semiconductor substrate and may be implemented in various wafers made of various materials (e.g., a material that includes glass).

In such a case, the modified areas R, which are made by the multiphoton absorption from the laser beam, are not limited to the above modified areas R that include the fused areas used in each of the above embodiments. For example, the modified areas may be appropriate ones that are suitable for the material of the wafer. For instance, in the case where the material of the wafer includes the glass, the modified areas R, which are formed by the multiphoton absorption, may be ones, which include areas that include the crack areas or that are changed in the terms of the refractive index.

The utilizable modified areas, which include the crack area or which are changed in the terms of the refractive index, are disclosed in, for example, Japanese Patent 3408805 that corresponds to U.S. Pat. No. 6,992,026B2, US2005/0173387A1, US2005/0181581A1, US2005/0184037A1, US2005/0189330A1, US2005/0194364A1, US2006/0040473A1 and US2006/0160331A1, contents of which are incorporated herein by reference.

(7) In each of the above embodiments, the wafer 10, 20 is cut and divided by expanding the dicing film 54. Alternatively, a curved surface (a bulged surface) of a curved object having a curvature (e.g., a semispherical object) may be urged against the predetermined cutting lines of the wafer 10, 20 to apply the urging force and to generate the shearing stress in the layers of the modified area groups, thereby cutting and dividing the wafer 10, 20.

Additional advantages and modifications will readily occur to those skilled in the art. The invention in its broader terms is therefore not limited to the specific details, representative apparatus, and illustrative examples shown and described.

What is claimed is:

1. A wafer cutting and dividing method comprising:

focusing a pulsed laser beam to a corresponding focal point at a corresponding depth in an interior of a wafer through a first surface of the wafer;

relatively moving the focal point of the laser beam relative to the wafer along a predetermined cutting line of the wafer to form a plurality of modified areas by multiphoton absorption from the laser beam in such a manner that the modified areas are arranged at corresponding constant intervals in a direction parallel to the first surface and a second opposite surface of the wafer;

sequentially changing the depth of the focal point of the laser beam and repeating the relatively moving of the focal point of the laser beam every time the depth of the focal point of the laser beam is changed, so that there is formed a plurality of layers of modified area groups, which are arranged one after another in a depth direction between the first surface and a second surface of the wafer, and the intervals of the modified areas in one of the plurality of layers of the modified area groups differ from the intervals of the modified areas in another one of the plurality of layers of the modified area groups, which is closer to the first surface of the wafer in comparison to the one of the plurality of layers of the modified area groups; and cutting and dividing the wafer along the predetermined cutting line through cracking of the wafer, which is started at the plurality of layers of the modified area groups formed along the predetermined cutting line.

2. The wafer cutting and dividing method according to claim 1, further comprising changing a pulse oscillation frequency of the laser beam such that the pulse oscillation frequency of the laser beam used to form the modified areas in the one of the plurality of layers of the modified area groups is lower than the pulse oscillation frequency of the laser beam used to form the modified areas in the another one of the plurality of layers of the modified area groups, so that the intervals of the modified areas in the one of the plurality of layers of the modified area groups become larger than the intervals of the modified areas in the another one of the plurality of layers of the modified area groups.

3. The wafer cutting and dividing method according to claim 2, wherein the changing of the pulse oscillation frequency of the laser beams is performed such that the pulse oscillation frequency of the laser beam becomes progressively lower to make the intervals of the modified areas progressively larger as the depth of the focal point of the laser beam from the first surface gets deeper.

4. The wafer cutting and dividing method according to claim 1, further comprising changing a pulse oscillation frequency of the laser beam such that the pulse oscillation frequency of the laser beam used to form the modified areas in the one of the plurality of layers of the modified area groups is higher than the pulse oscillation frequency of the laser beam used to form the modified areas in the another one of the plurality of layers of the modified area groups, so that the intervals of the modified areas in the one of the plurality of layers of the modified area groups become smaller than the intervals of the modified areas in the another one of the plurality of layers of the modified area groups.

5. The wafer cutting and dividing method according to claim 4, wherein the changing of the pulse oscillation frequency of the laser beams is performed such that the pulse oscillation frequency of the laser beam becomes progressively higher to make the intervals of the modified areas progressively smaller as the depth of the focal point from the first surface gets deeper.

6. The wafer cutting and dividing method according to claim 1, further comprising changing a relative moving speed of the focal point of the laser beam in such a manner that the relative moving speed of the focal point of the laser beam used to form the modified areas in the one of the plurality of layers of the modified area groups is lower than the relative moving speed of the focal point of the laser beam used to form the modified areas in the another one of the plurality of layers of the modified area groups, so that the intervals of the modified areas in the one of the plurality of layers of the modified area groups become smaller than the intervals of the modified areas in the another one of the plurality of layers of the modified area groups.

7. The wafer cutting and dividing method according to claim 6, wherein the changing of the relative moving speed of the focal point of the laser beam is performed such that the relative moving speed of the focal point of the laser beam becomes progressively lower to make the intervals of the modified areas progressively smaller as the depth of the focal point from the first surface gets deeper.

8. The wafer cutting and dividing method according to claim 1, the sequentially changing of the depth of the focal point of the laser beam is performed such that a depth extent of each modified area in one of consecutive two of the plurality of layers of the modified area groups is spaced from or is adjacent to or is overlapped with a depth extent of a closest one of the modified areas of the other one of the consecutive two of the plurality of layers of the modified area groups.

9. The wafer cutting and dividing method according to claim 1, wherein the wafer is a semiconductor wafer, which has a multilayer structure.

10. The wafer cutting and dividing method according to claim 1, wherein the wafer is a semiconductor wafer, which is made of a semiconductor bulk material.

* * * * *